United States Patent
Li et al.

(10) Patent No.: US 11,377,347 B2
(45) Date of Patent: Jul. 5, 2022

(54) METHOD FOR MANUFACTURING SEMICONDUCTOR STRUCTURE AND PLANARIZATION PROCESS THEREOF

(71) Applicant: UNITED MICROELECTRONICS CORPORATION, Hsinchu (TW)

(72) Inventors: Xiang Li, Singapore (SG); Ding Lung Chen, Singapore (SG)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 76 days.

(21) Appl. No.: 16/917,901

(22) Filed: Jul. 1, 2020

(65) Prior Publication Data
US 2021/0354983 A1  Nov. 18, 2021

(30) Foreign Application Priority Data
May 18, 2020 (CN) .......................... 202010418410.3

(51) Int. Cl.
*B81C 1/00* (2006.01)

(52) U.S. Cl.
CPC ... *B81C 1/00611* (2013.01); *B81C 2201/0118* (2013.01); *B81C 2201/0119* (2013.01); *B81C 2201/0121* (2013.01)

(58) Field of Classification Search
CPC ......... B81C 1/00611; B81C 2201/0118; B81C 2201/0119; B81C 2201/0121; B81C 2201/0123; B81C 2201/0126; B81B 2201/0235; B81B 2201/0242; B81B 2203/033
See application file for complete search history.

(56) References Cited

U.S. PATENT DOCUMENTS

| | | |
|---|---|---|
| 6,743,495 B2 | 6/2004 | Vasat et al. |
| 6,846,746 B2 | 1/2005 | Rattner et al. |
| 10,029,910 B1 * | 7/2018 | Tseng .................. B81C 1/00285 |
| 2004/0060899 A1 | 4/2004 | Waldhauer et al. |

(Continued)

OTHER PUBLICATIONS

Suwa et al. ("Flattening Technique of (551) Silicon Surface using Xe/He Plasma," 225th ECS Meeting, May 11-15, 2014) (Year: 2014).*

*Primary Examiner* — Yasser A Abdelaziez

(57) ABSTRACT

A method for manufacturing semiconductor structure includes: providing a substrate having a first surface; forming a trench on the first surface, wherein a bottom surface and side walls of the substrate are configured along an outer periphery of the trench; annealing the substrate with high-purity argon or high-purity hydrogen to flatten the bottom surface and the side walls; conformally disposing a composite-material layer to cover the first surface, the bottom surface and the side walls; disposing a polysilicon material layer in the trench; removing the composite-material layer on the first surface; forming a multi-layer metal interconnection structure on the first surface and the polysilicon material layer, the multi-layer metal interconnection structure including a MEMS frame structure and through holes; removing the polysilicon material layer and the composite-material layer; using plasma treatment to the trench to flatten the bottom surface and the side walls. The plasma contains inert gas and hydrogen.

9 Claims, 6 Drawing Sheets

(56) References Cited

U.S. PATENT DOCUMENTS

| | | | |
|---|---|---|---|
| 2006/0063392 A1* | 3/2006 | Ventzek | H01L 21/318 |
| | | | 257/E21.292 |
| 2008/0229620 A1* | 9/2008 | Corbett | A43D 999/00 |
| | | | 36/134 |
| 2014/0145272 A1* | 5/2014 | Or-Bach | H01L 27/092 |
| | | | 257/369 |
| 2015/0069581 A1* | 3/2015 | Chang | H01L 21/2633 |
| | | | 438/712 |

* cited by examiner

METHOD FOR MANUFACTURING SEMICONDUCTOR STRUCTURE AND PLANARIZATION PROCESS THEREOF

FIELD OF THE INVENTION

The present invention relates to a semiconductor manufacturing process, and more particularly to a method for manufacturing a semiconductor structure and a planarization process thereof for flattening a bottom surface and/or side walls of a trench.

BACKGROUND OF THE INVENTION

With the advancement of science and technology, consumer electronics products continue to be miniaturized and their performance and functions are constantly improving. Various types of consumer electronic products continue to develop in the direction of light, thin, powerful and low cost, so micro-electromechanical system (MEMS) devices such as MEMS capacitors, micro-acoustical sensor, micro-gyro sensors, accelermeter, clock generation and oscillator or MEMS microphone, have been developed.

Since the fabrication of MEMS devices may use film deposition, lithography, etching, and other similar semiconductor process technologies, it has good compatibility with complementary metal oxide semiconductor (CMOS) technology. For example, MEMS capacitors are fabricated on a silicon substrate with an air gap, but with the progress of etching and other processes in the manufacturing process, the bottom surface or the side walls of the air gap are easy to have unevenness such as higher roughness, which may affect the reliability of the MEMS capacitor.

SUMMARY OF THE INVENTION

The present invention provides a method for manufacturing a semiconductor structure and a planarization process thereof, by which to flatten the bottom surface and/or side walls of the trench, thereby improving the situation where the bottom surface or side walls are easy to have unevenness such as higher roughness.

The method for manufacturing the semiconductor structure provided by the present invention includes steps of: providing a substrate having a first surface; forming at least one trench on the first surface, wherein a bottom surface and a plurality of side walls of the substrate are configured along an outer periphery of the trench; performing a first planarization process including annealing the substrate with trench thereon in an annealing ambient containing a gas selected from one of argon and hydrogen to flatten at least one of the bottom surface and the side walls; conformally disposing a composite-material layer to cover the first surface, the bottom surface and the side walls; disposing a polysilicon material layer in the trench, wherein the polysilicon material layer covers the composite-material layer on the bottom surface and the side walls; removing the composite-material layer on the first surface; forming a multilayer metal interconnection structure on the first surface and the polysilicon material layer, wherein the multilayer metal interconnection structure includes a MEMS frame structure and a plurality of through holes; removing the polysilicon material layer and the composite-material layer in the trench; and performing a second planarization process, in which a plasma treatment is used to process the trench to flatten the bottom surface and the side walls, wherein the plasma treatment includes a plasma containing inert gas and hydrogen.

In one embodiment of the present invention, the step of conformally disposing the composite-material layer includes steps of: conformally forming a liner oxide layer to cover the first surface and the bottom surface and the side walls of the at least one trench; and conformally forming a passivation layer on the liner oxide layer.

In one embodiment of the present invention, during the above first planarization process, the annealing ambient contains the argon and an anneal temperature is between 750° C. and 1100° C.

In one embodiment of the present invention, during the above first planarization process, the annealing ambient contains the hydrogen and an anneal temperature is between 750° C. and 1100° C.

In one embodiment of the present invention, during the above second planarization process, a temperature of the plasma treatment is between 300° C. and 400° C.

In one embodiment of the present invention, a content of the hydrogen in the plasma is between 2.5% and 10%, and a content of the inert gas is between 90% and 97.5%.

In one embodiment of the present invention, after disposing the polysilicon material layer in the trench, a polishing process is performed to make a top surface of the polysilicon material layer and the composite-material layer be at the same height.

In one embodiment of the present invention, before or after removing the composite-material layer on the first surface, a portion of the polysilicon material layer is removed by an etching back process to make a top surface of the polysilicon material layer and the first surface of the substrate be at the same height.

In one embodiment of the present invention, the MEMS frame structure corresponds to a position of the trench, and some of the plurality of through holes connect with the at least one trench.

The planarization process provided by the present invention includes steps of: providing a semiconductor structure including a substrate, at least one trench formed on the substrate, and a multilayer metal interconnection structure disposed on the substrate, wherein a bottom surface and a plurality of side walls of the substrate are configured along an outer periphery of the trench, and the multilayer metal interconnection structure includes a MEMS frame structure and a plurality of through holes; and using a plasma treatment to process the trench to flatten the bottom surface and the side walls of the trench, wherein a plasma of the plasma treatment contains inert gas and hydrogen.

The planarization process provided by the present invention includes steps of: providing a semiconductor structure including a substrate and at least one trench formed on the substrate, wherein a bottom surface and a plurality of side walls of the substrate are configured along an outer periphery of the trench; and annealing the substrate with the trench thereon in an annealing ambient containing a gas selected from one of argon and hydrogen to flatten the bottom surface and the side walls.

The present invention utilizes argon or hydrogen to anneal the substrate to flatten the bottom and/or side walls of the trench formed on the substrate. After the metal interconnection structure (including the MEMS frame structure) is provided on the substrate, a plasma containing inert gas and hydrogen is used to plasma treat the trench to flatten the bottom and/or side walls of the trench, thereby improving the situation where the bottom surface or the side wall formed in the substrate located at the trench is easy to have unevenness such as high roughness.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
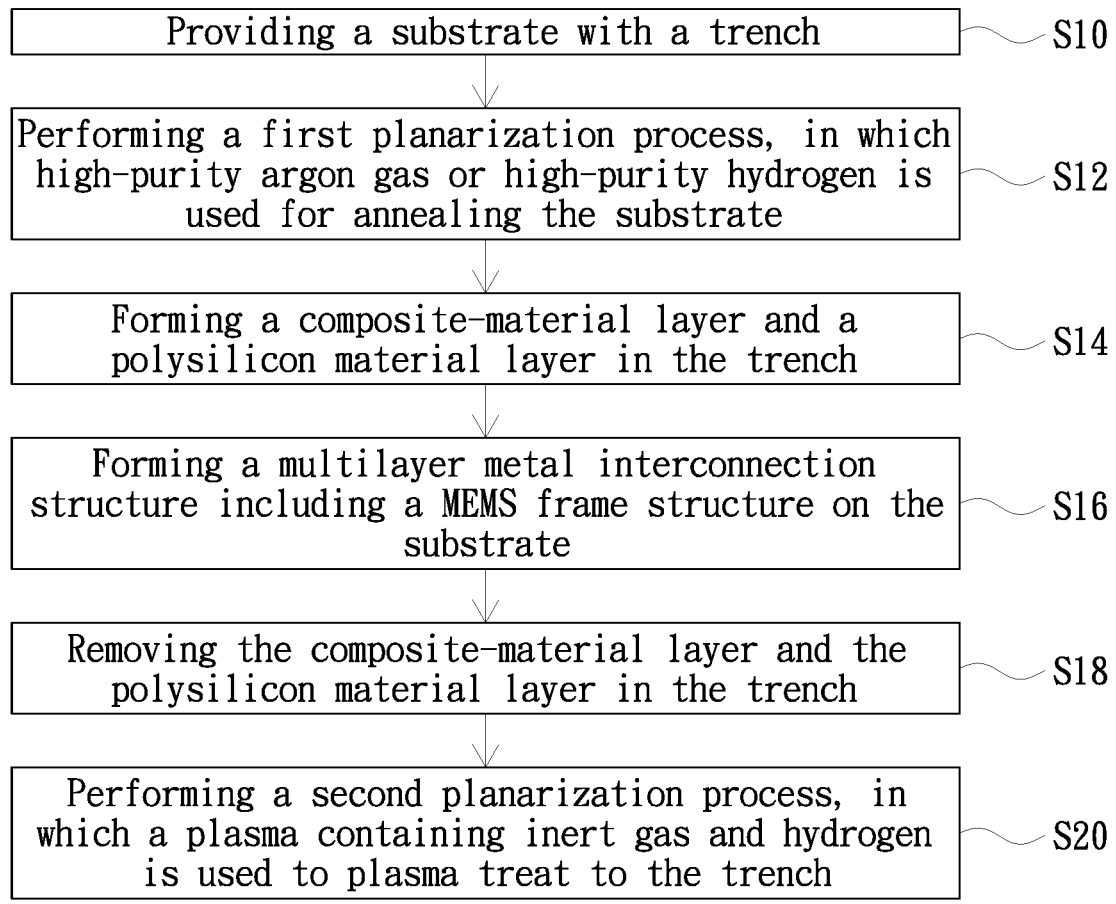
FIG. 1 is a schematic flowchart of a method for manufacturing a semiconductor structure according to an embodiment of the present invention.
Figure 2A:
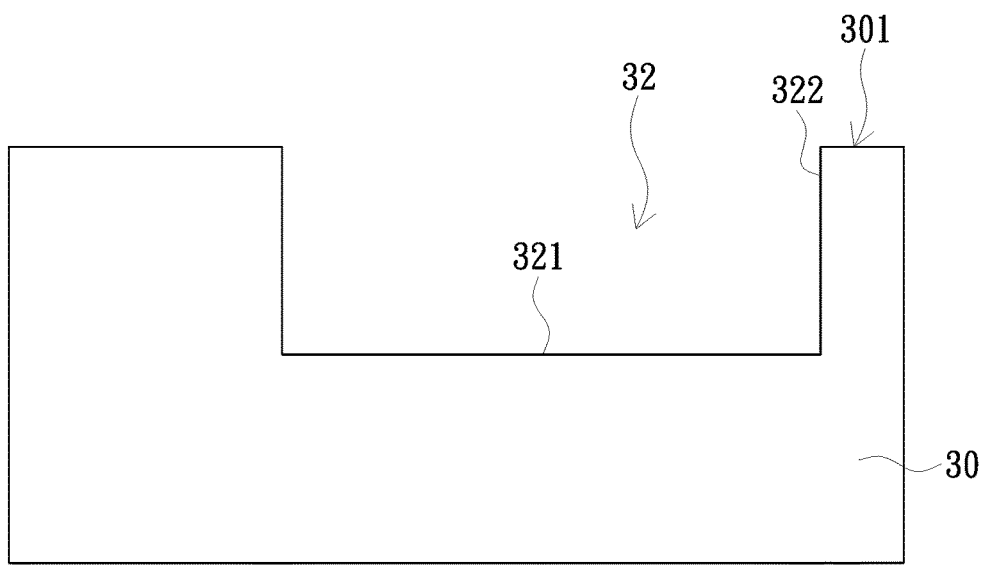
FIGS. 2A to 2I are schematic cross-sectional views for illustrating a method for manufacturing a semiconductor structure according to an embodiment of the present invention.

FIG. 1 is a schematic flowchart of a method for manufacturing a semiconductor structure according to an embodiment of the present invention, and FIGS. 2A to 2I are schematic cross-sectional views for illustrating a method for manufacturing a semiconductor structure according to an embodiment of the present invention. As shown in FIG. 1, a substrate 30 is provided, which is step S10. The substrate 30 is, for example, a silicon substrate, an epitaxial silicon substrate, a silicon germanium substrate, a silicon carbide substrate or silicon on insulation (SOI) substrate. As shown in FIG. 2A, the substrate 30 has a first surface 301 and a trench 32 is formed on the first surface 301, wherein the number of trenches 32 is not limited to one. In one embodiment, the trench 32 is formed by etching and the trench 32 has a bottom surface 321 and opposite side walls 322 formed in the substrate 30, so that the bottom surface 321 and the opposite sidewalls 322 are configured and disposed directly along outer boundary or periphery of the trench 32.

Next, a first planarization process is performed, which is step S12, to flatten the bottom surface 321 and the side walls 322 of the trench 32. During the first planarization process, the substrate 30 with the trench 32 thereon is annealed in an annealing ambient containing by using one of the high-purity argon (Ar) and the high-purity hydrogen ($H_2$). Wherein, if the high-purity argon is used in the annealing ambient, an anneal temperature is between 750° C. and 1100° C., and the preferred anneal temperature is 800° C.; if the high-purity hydrogen is used in the annealing ambient, the anneal temperature is between 750° C. and 1100° C., and the preferred anneal temperature is 1000° C.

Figure 2B:
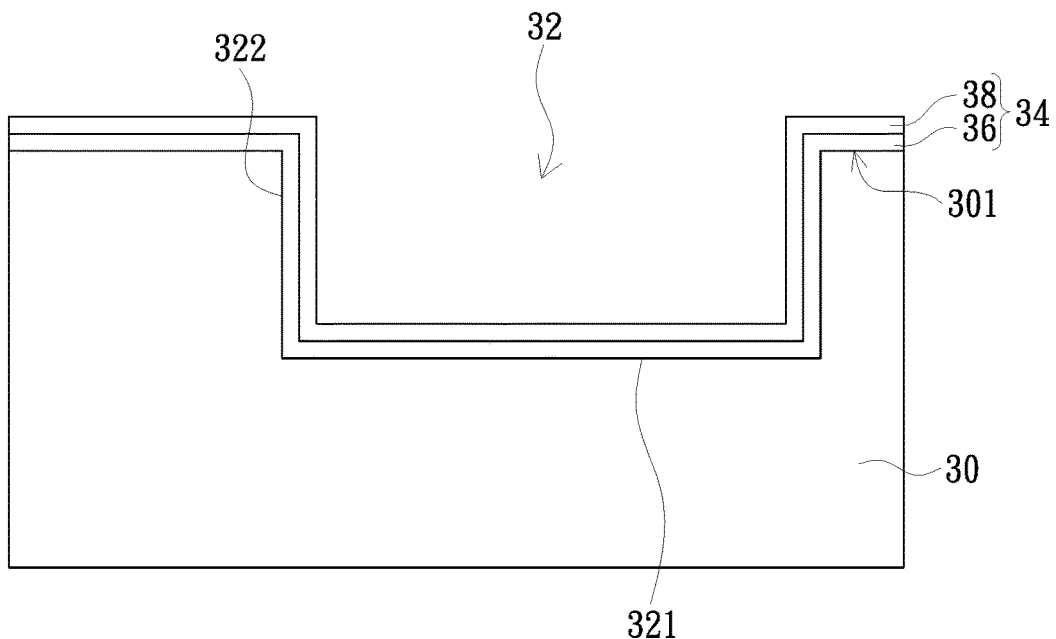
Figure 2C:
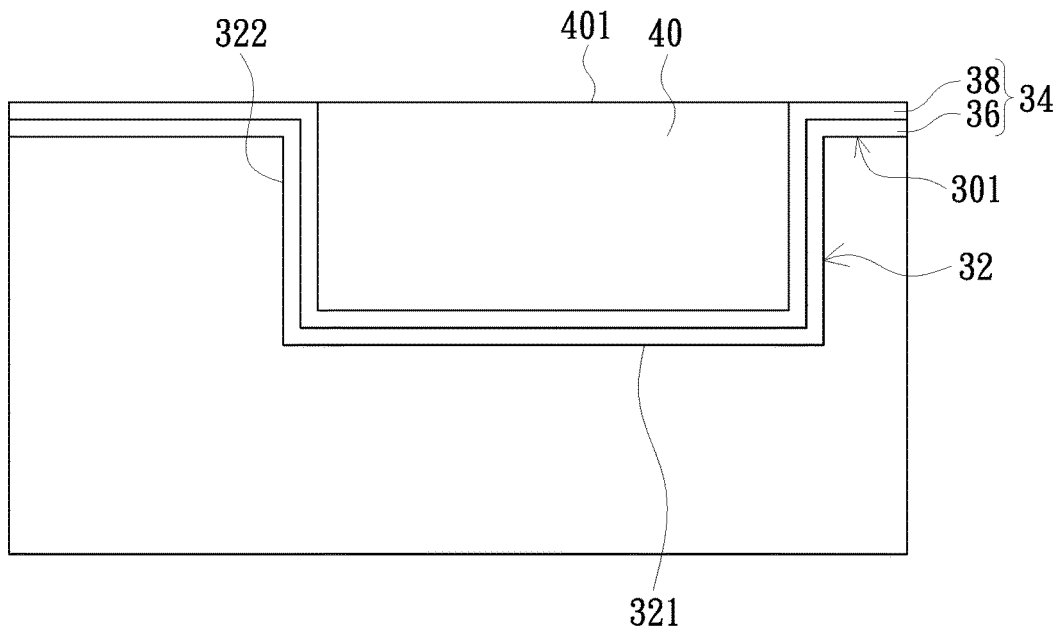
Figure 2D:
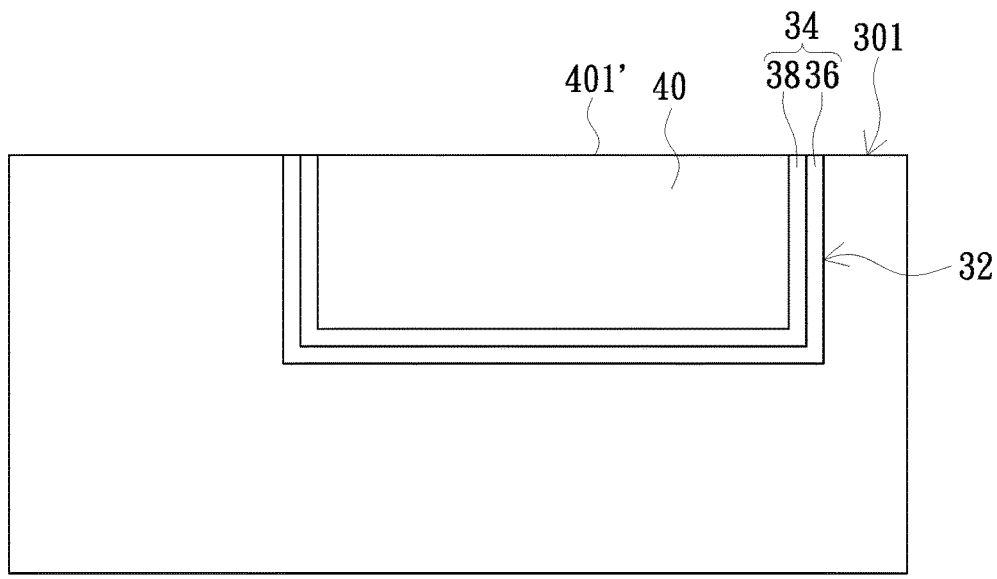

Then, a composite-material layer 34 and a polysilicon material layer 40 are formed in the trench 32, which is step S14, and the process flow for forming the composite-material layer 34 and the polysilicon material layer 40 is shown in FIGS. 2B to 2D. As shown in FIG. 2B, the composite-material layer 34 is conformally disposed to cover the first surface 301, the bottom surface 321 and the side walls 322 of the trench 32. In one embodiment, the composite-material layer 34 includes a liner oxide layer 36 and a passivation layer 38, wherein the liner oxide layer 36 is first conformally formed to cover the first surface 301 and the bottom surface 321 and the sidewalls 322 of the trench 32, and the passivation layer 38 is then conformally formed on the liner oxide layer 36. The material of the passivation layer 38 is, for example, silicon nitride. Next, as shown in FIG. 2C, the polysilicon material layer 40 is disposed in the trench 32 to cover the composite-material layer 34 on the bottom surface 321 and the side walls 322. In one embodiment, after the polysilicon material layer 40 is deposited in the trench 32, a polishing process is performed to make a top surface 401 of the polysilicon material layer 40 and the composite-material layer 34 be at the same height or coplanar. In one embodiment, a chemical-mechanical planarization (CMP) method is used for the polishing process. Then, as shown in FIG. 2D, the composite-material layer 34 disposed on the first surface 301 is removed, while the composite-material layer 34 in the trench 32 remains. In one embodiment, before or after the composite-material layer 34 on the first surface 301 is removed, an etching back process is used to remove a portion of the polysilicon material layer 40 to make the top surface 401' of the polysilicon material layer 40 and the first surface 301 of the substrate 30 be at the same height or coplanar.

Figure 2E:
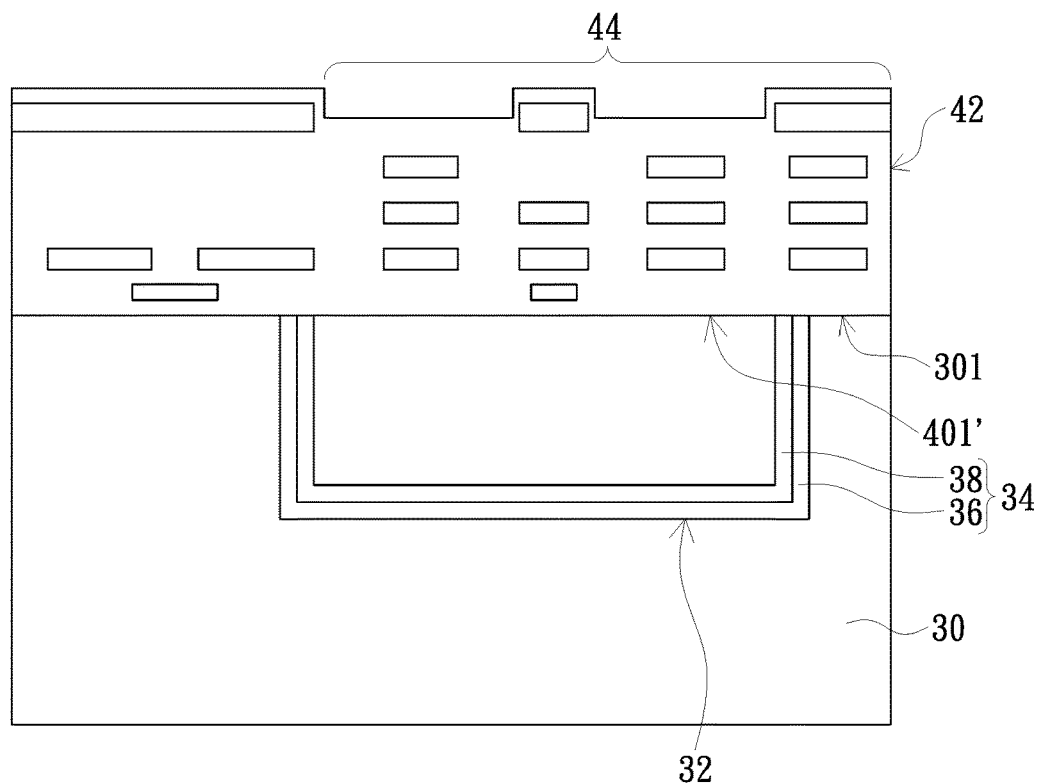
Figure 2F:
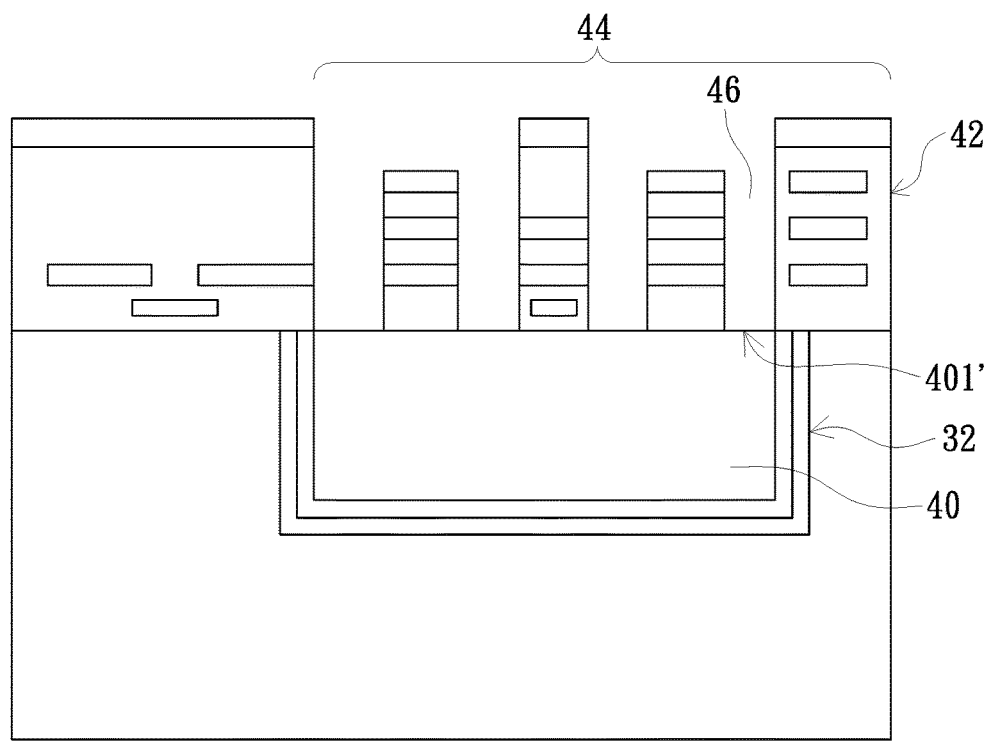

Then, a multilayer metal interconnection structure 42 including a micro-electromechanical system (MEMS) frame structure 44 is formed on the substrate 30, which is step S16. As shown in FIG. 2E, the multilayer metal interconnection structure 42 is formed on the first surface 301, the top surface 401' of the polysilicon material layer 40 and the exposed surface of the composite-material layer 34, wherein the multilayer metal interconnection structure 42 includes the MEMS frame structure 44. In one embodiment, the area of the MEMS frame structure 44 may partially or completely correspond to the position of the trench 32 on the substrate 30. Next, as shown in FIG. 2F, a plurality of through holes 46 are formed in the multilayer metal interconnection structure 42. In one embodiment, the through holes 46 are formed by an etching process, and the through holes 46 penetrate the multilayer metal interconnection structure 42 and extend to the top surface 401' of the polysilicon material layer 40.

Figure 2G:
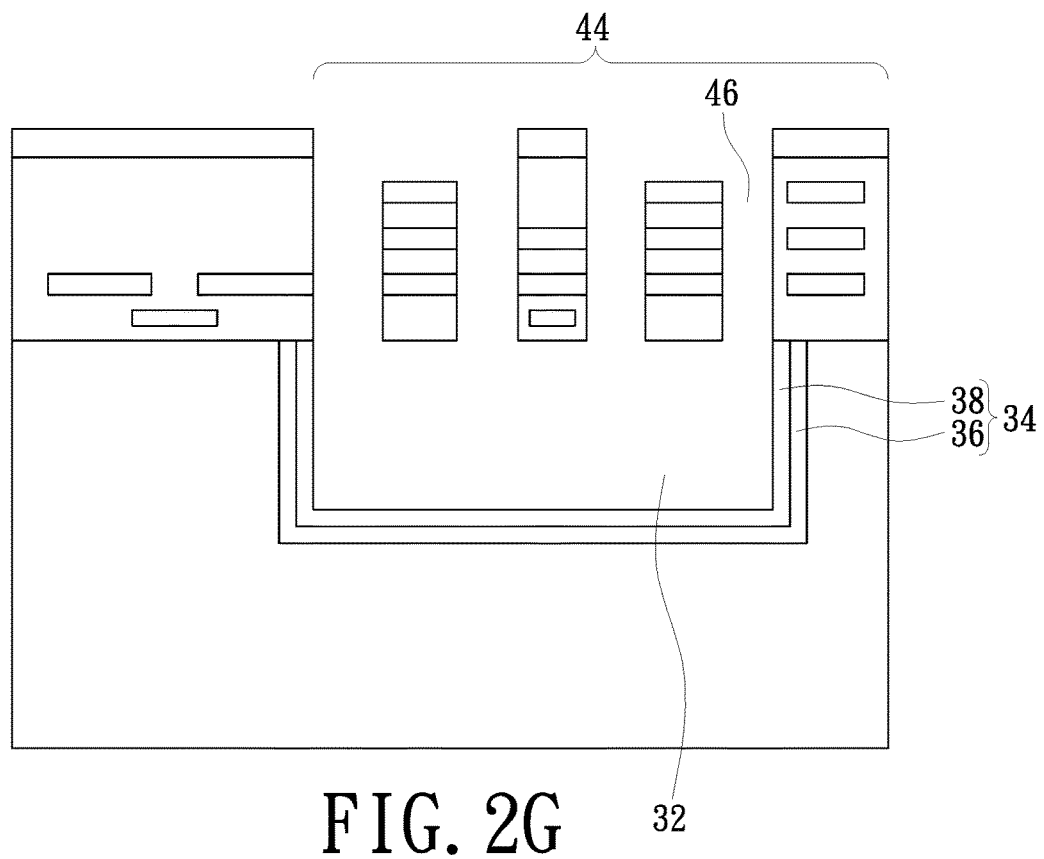
Figure 2H:
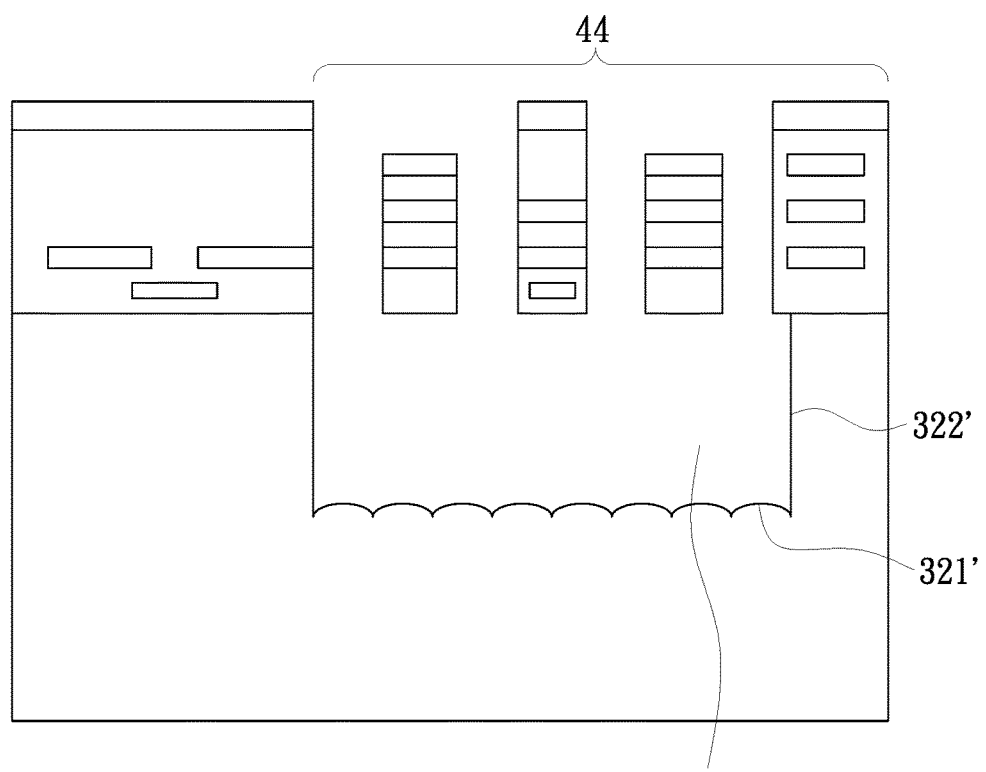

Next, the composite-material layer 34 and the polysilicon material layer 40 in the trench 30 are removed, which is step S18. Please refer to FIGS. 2G and 2H, the polysilicon material layer 40 in the trench 32 is first removed, as shown in FIG. 2G, so that the through holes 46 communicate with the trench 32, wherein the polysilicon material layer 40 is removed by, for example, an etching process. In the etching process, an etching solution such as tetramethylammonium hydroxide (TMAH), potassium hydroxide (KOH), or ethylenediamine catechol (EDP) may be used for wet etching the polysilicon material layer 40. Then, the composite-material layer 34 in the trench 32 is removed, as shown in FIG. 2H, to expose the bottom surface 321' and the side walls 322' of the trench 32. In one embodiment, the composite-material layer 34 is removed by a common etching process, for example; wherein the trench 32 may be likely to leave the rough bottom surface 321' and/or the side walls 322'.

Figure 2I:
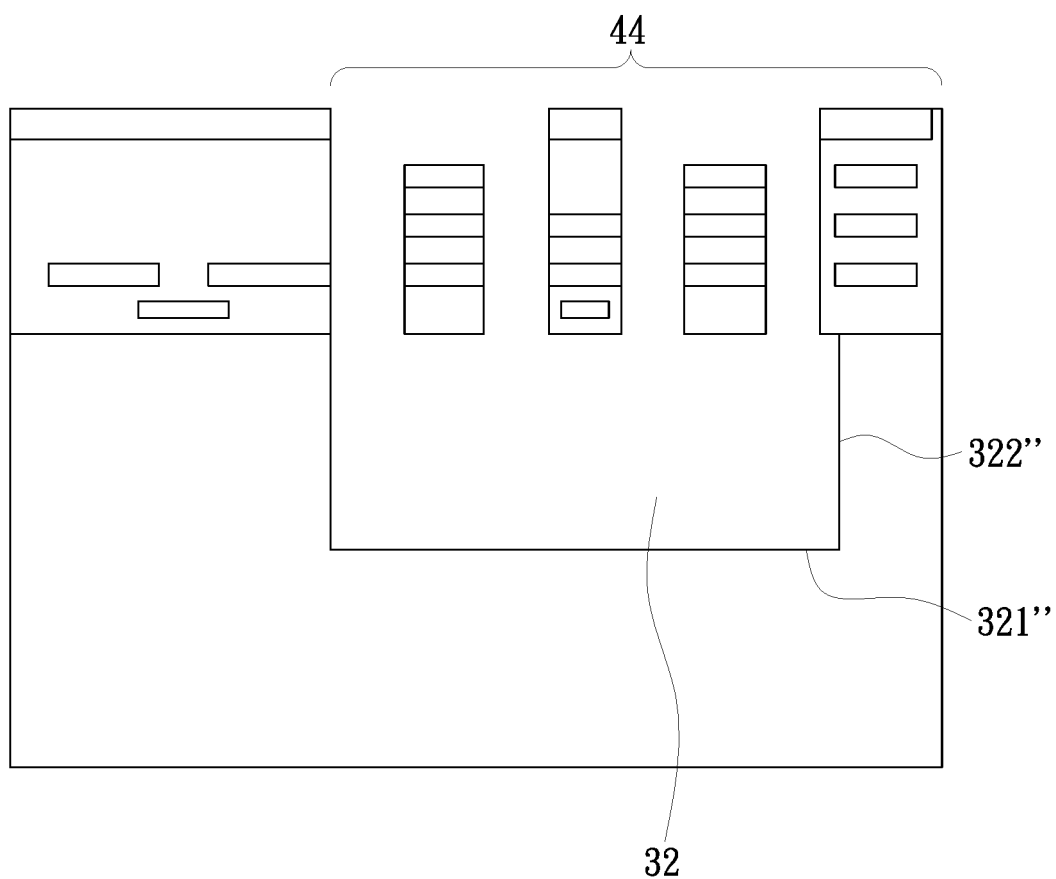

Finally, a second planarization process is performed, which is step S20, in which the trench 32 is treated by plasma treatment with a plasma containing an inert gas and hydrogen, as shown in FIG. 2I, to eliminate or reduce the roughness of the bottom surface 321" and the side wall 322" of the trench 32, so that the bottom surface 321" and the side wall 322" of the trench 32 are flattened. In one embodiment, a temperature of the plasma treatment is between 300° C. and 400° C., the preferred treatment temperature is 400° C. In the plasma, the content of hydrogen is much smaller than the content of inert gas, for example, the content of hydrogen is between 2.5% and 10% and the content of inert gas is between 97.5% and 90%. Preferably, the hydrogen content is 5% and the inert gas content is 95%.

Therefore, in the method for manufacturing a semiconductor structure according to an embodiment of the present invention, the bottom surface and side walls of the trench on the substrate can be flattened by the first planarization process, in which the high-purity argon or the high-purity hydrogen is used to anneal the substrate. When the multi-layer metal interconnection structure including the MEMS frame structure has been formed on the substrate, the bottom surface and the side walls of the trench under the MEMS frame structure can be flattened by the second planarization process, in which a plasma containing an inert gas and a small amount of hydrogen is used to plasma treat the trench to flatten the bottom surface and side walls of the trench. In this way, the situation that the bottom surface and the side walls of the trench are easy to have unevenness such as high roughness is effectively eliminated by the improved method for manufacturing the semiconductor structure, and the reliability of the subsequent manufacturing of the entire capacitor with a MEMS frame is improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a semiconductor structure, comprising steps of:
    providing a substrate having a first surface;
    forming at least one trench on the first surface of the substrate, wherein a bottom surface and a plurality of side walls of the substrate are configured along an outer periphery of the at least one trench;
    performing a first planarization process comprising annealing the substrate with the at least one trench thereon in an annealing ambient comprising a gas selected from one of argon and hydrogen to flatten at least one of the bottom surface and the side walls of the at least one trench;
    conformally disposing a composite-material layer to cover the first surface of the substrate, the bottom surface and the side walls of the at least one trench;
    disposing a polysilicon material layer in the at least one trench, wherein the polysilicon material layer covers the composite-material layer on the bottom surface and the side walls;
    removing the composite-material layer on the first surface;
    forming a multilayer metal interconnection structure on the first surface and the polysilicon material layer, wherein the multilayer metal interconnection structure comprises a micro-electromechanical system (MEMS) frame structure and a plurality of through holes;
    removing the polysilicon material layer and the composite-material layer in the at least one trench; and
    performing a second planarization process, in which a plasma treatment is used to process the at least one trench to flatten the bottom surface and the side walls thereof, wherein the plasma treatment comprises a plasma comprising inert gas and hydrogen.

2. The method for manufacturing the semiconductor structure according to claim 1, wherein the step of conformally disposing the composite-material layer comprises steps of:
    conformally forming a liner oxide layer to cover the first surface of the substrate and the bottom surface and the side walls of the at least one trench; and
    conformally forming a passivation layer on the liner oxide layer.

3. The method for manufacturing the semiconductor structure according to claim 1, wherein during the first planarization process, the annealing ambient comprises argon and an anneal temperature is between 750° C. and 1100° C.

4. The method for manufacturing the semiconductor structure according to claim 1, wherein during the first planarization process, the annealing ambient comprises hydrogen and an anneal temperature is between 750° C. and 1100° C.

5. The method for manufacturing the semiconductor structure according to claim 1, wherein during the second planarization process, a temperature of the plasma treatment is between 300° C. and 400° C.

6. The method for manufacturing the semiconductor structure according to claim 1, wherein a content of hydrogen in the plasma is between 2.5% and 10%, and a content of inert gas is between 90% and 97.5%.

7. The method for manufacturing the semiconductor structure according to claim 1, wherein after disposing the polysilicon material layer in the at least one trench, a polishing process is performed to make a top surface of the polysilicon material layer and the composite-material layer be at the same height.

8. The method for manufacturing the semiconductor structure according to claim 1, wherein before or after removing the composite-material layer on the first surface, a portion of the polysilicon material layer is removed by an etching back process to make a top surface of the polysilicon material layer and the first surface of the substrate be at the same height.

9. The method for manufacturing the semiconductor structure according to claim 1, wherein the MEMS frame structure corresponds to a position of the at least one trench, and some of the plurality of through holes communicate with the at least one trench.

* * * * *